(12) United States Patent
Alazraki et al.

(10) Patent No.: US 6,980,775 B2
(45) Date of Patent: Dec. 27, 2005

(54) AUTOMATIC FREQUENCY CONTROL (AFC) SYSTEM AND METHOD USING AN ADAPTIVE THRESHOLD TO IMPROVE ACCURACY OF THE DIRECT CURRENT (DC) COMPONENT CALCULATION FOR A RECEIVED SIGNAL

(75) Inventors: Scott Michael Alazraki, Davie, FL (US); Amish Pravinbhai Shah, Philadelphia, PA (US); Jesus Francisco Corretjer, Weston, FL (US)

(73) Assignee: Motorola, Inc., Schaumberg, IL (US)

( * ) Notice: Subject to any disclaimer, the term of this patent is extended or adjusted under 35 U.S.C. 154(b) by 599 days.

(21) Appl. No.: 10/331,218

(22) Filed: Dec. 30, 2002

(65) Prior Publication Data

US 2004/0127171 A1 Jul. 1, 2004

(51) Int. Cl.[7] ................................................. H04B 1/40
(52) U.S. Cl. .......................... 455/75; 455/77; 455/87; 455/182.1; 455/182.2; 455/182.3; 455/192.1; 455/192.2; 455/192.3; 375/344
(58) Field of Search ............................. 455/75, 77, 87, 455/182.1, 182.2, 182.3, 192.1, 192.2, 192.3, 455/226.1; 375/344

(56) References Cited

U.S. PATENT DOCUMENTS 5,233,633 A * 8/1993 Baum et al. ................. 375/344
5,552,838 A * 9/1996 Suizu .......................... 348/735
5,594,757 A * 1/1997 Rohani ........................ 375/344
5,678,223 A * 10/1997 Callaway et al. ............ 455/324
5,963,851 A   10/1999 Blanco et al.
6,148,187 A * 11/2000 Chiba ....................... 455/192.2
6,522,696 B1 * 2/2003 Mobin et al. ................ 375/262

* cited by examiner

Primary Examiner—Nay Maung
Assistant Examiner—Sujatha Sharma

(57) ABSTRACT

A radio device requires a tunable transceiver such that the transceiver can be accurately set to a desired frequency. When a signal with known frequency accuracy is being received, an offset detector can determine the frequency offset generated by the transceiver due to improper tuning. An automatic frequency control (AFC) system (100) is comprised of a tunable transceiver, an adaptive detector (102) for comparing an incoming sample from the tunable transceiver to an adaptive maximum deviation threshold for determining if a sample from the tunable transceiver should be used for the direct current (DC) component of the AFC, an offset detector (103) and an AFC control processor (105) for utilizing information from the offset detector to reduce the inaccuracy in frequency by tuning the transceiver towards the received signal frequency. The AFC control processor (105) utilizes one of more threshold levels for defining a maximum correction threshold (311) based upon the desired maximum offset correction.

19 Claims, 3 Drawing Sheets

AUTOMATIC FREQUENCY CONTROL (AFC) SYSTEM AND METHOD USING AN ADAPTIVE THRESHOLD TO IMPROVE ACCURACY OF THE DIRECT CURRENT (DC) COMPONENT CALCULATION FOR A RECEIVED SIGNAL

TECHNICAL FIELD

This invention relates in general to radio transceivers and more particularly to frequency control in a two-way radio transceiver.

BACKGROUND

Various forms of frequency modulation (FM) are commonly used in radio communications and more particularly in public safety radio services. When a received FM radio frequency signal is filtered using a filter that does not meet Carson's Rule for the bandwidth of FM signals, distortion of the phase information of the recovered signal will take place. In Carson's rule, the required filter bandwidth ($B_T$) to recover 98% of the total power of the FM signal is given by the formula $B_T=2*\Delta F+2*B$, where $\Delta F$ is the peak frequency deviation and B is the bandwidth of the modulating signal. The distortion of the phase information will result in an inaccurate computation of the direct current (DC) component of the FM signal. Any algorithm, which requires an accurate DC component value for the recovered signal, will experience problems due to this distortion. As is further known in the art, the DC component is proportional to the frequency offset between the received signal and the transceiver operating frequency. Due to limitations of the transceiver's intermediate frequency (IF) filter design, the current implementation of this discriminator algorithm exhibits a phenomenon when the received signal is approximately +/−3.5 to 4 KHz offset in frequency from the transceiver operating frequency and of nominal deviation. This problem is even greater importance for signals that are low in signal strength. This received signal may be the profile of an interfering and undesired signal.

In these cases, the IF filtering of the I/Q samples for FM, violates Carson's Rule for the bandwidth required for FM signals. In this case the phase difference information in the discriminator buffer is distorted. When the signal strength of the received signal is weak and/or the frequency offset is very large, the discriminated data will become even further distorted. An example of this type of algorithm which requires an accurate DC component value, is one used in connection with automatic frequency control (AFC). The AFC algorithm uses the DC component value calculated from the distorted discriminator data. This distortion can lead to the AFC pulling the tunable transceiver off frequency when no frequency control was necessary. This has the result of negatively affecting the RF sensitivity of the transceiver.

In U.S. Pat. No. 5,963,851 ("Automatic Frequency Control System Using Multiple Threshold Levels and Method of Using Same," Motorola, Inc.) which is herein incorporated by reference, a system and method for using certain thresholds for limiting the Automatic Frequency Control (AFC) is taught. The implementation of the Offset Detector of this invention is handled in a Digital Signal Processor (DSP). The Offset Detector works by extracting the DC component of the demodulated signal and passing it to the AFC processor. The discriminator algorithm computes the phase difference information accounting for phase "wrap around".

The algorithm relies on the axiom that a phase angle will "wrap around" a unit circle to $-\pi$ if it increases beyond $\pi$, where "unwrap" is performed by adding $2\pi$.

Using an IF filter that does not meet Carson's rule results in added distortion in the filtered I/Q samples since energy from the side lobes of the spectrum for the FM signal will be eliminated. The distortion of the I/Q samples of the FM signal can lead the discriminator to incorrectly compute a phase difference that "wraps around" when it should not have done so. A phase difference of a value that is slightly greater than 1 (for a positive frequency offset) will "wrap around" to a large, negative number. In a similar manner, a phase difference of a value that is slightly less than −1 (for a negative frequency offset) will "wrap around" to a large, positive number. The "wrap around" is still a necessity of the discriminator algorithm, as was shown earlier. However, "wrap around" that is caused by distortion of the FM signal (by an IF filter that does not meet Carson's rule) is not desirable.

In practice, the solution to this problem is not achieved by merely designing a better IF filter. There is an implied tradeoff since it is difficult to widen the bandwidth of the IF filters (to satisfy Carson's rule for all possible signals that we may receive) because the filters must also meet governmental standards for "adjacent channel rejection".

Therefore, if one were to widen the bandwidth, it would also be necessary to sharpen the roll-off of the filter to meet adjacent channel rejection goals. This would require the use of more "taps" to obtain a filter that approaches the frequency response of an ideal "brick wall" filter. However, this would also increase processing power (MIPS) which results in greater current drain. In obtaining this goal, often the Carson's rule requirement is infringed upon. The decision is justified by acknowledging that "most" of the desired FM signals that are to be received by the FM transceiver, are of a smaller bandwidth (nominal deviation), and remain within the filter cutoff frequency. However, when an FM signal received by a transceiver is outside of the desired range of the filter, this type of distortion will occur. The distortion will affect other algorithms (like AFC) which will degrade the discriminated data.

Hence, the AFC processor will not retune the tunable transceiver for some DC component however the offset detector will calculate a DC component of some lesser value. The number of discriminated samples that are falsely represented as large negative/positive values will determine how much below/above the Offset Detector will calculate the reported DC component value. As the same signal gets weaker, more discriminated samples are represented as a large negative/positive number. In this situation, the DC component will be calculated as a lower/higher value than the true DC component (due to so many large negative/positive values being averaged in), and can even fall within the "hardware tuning threshold" that is described in U.S. Pat. No. 5,963,851. In this case, the AFC Processor will falsely retune the tunable transceiver towards this offset carrier. This is erroneous since the true DC component was actually outside of the "hardware tuning threshold". The re-tuning of the tunable transceiver can actually adjust the tuned carrier frequency up to the "maximum correction threshold" as described in U.S. Pat. No. 5,963,851. This means that the transceiver will be tuned incorrectly in this situation, and will not be stopped until the "maximum correction threshold" is reached. This threshold is a protective mechanism so that AFC does not pull the tunable transceiver too far off frequency. However, it does allow for tuning changes of at least the "hardware tuning threshold" (of +/−2 kHz) in the implementation. Such tuning changes will degrade RF sensitivity of the tunable transceiver.

Thus, the need exists to provide an adaptive threshold to improve accuracy of the DC component calculation for use with an automatic frequency control in a two-way radio system to ensure proper operation of AFC tuning compensation during varying signal conditions. This technique enhances previous systems and methods of preventing signal degradation and/or distortion due to improper tuning using AFC in the radio transceiver.

SUMMARY OF THE INVENTION

Briefly, according to the invention, there is provided a system and method for setting up a new adaptive threshold and an algorithm for using the threshold. Each discriminated sample is screened with this threshold/algorithm to determine if it should be used to compute the DC component for AFC (or other algorithms needing an accurate DC component). This will ensure stable operation of the AFC. The new threshold is best termed as the "Adaptive Maximum Deviation" threshold. The threshold is adaptive since it is dependent upon the DC component, which estimates the frequency offset (frequency error) of the received signal. Each new discriminator sample (phase difference information) is compared against the "Adaptive Maximum Deviation" threshold to check the validity of the phase difference information. The algorithm uses the DC component of the received signal and computes the "Adaptive Maximum Deviation" threshold based upon the DC component and the "adjusted maximum deviation value". The "adjusted maximum deviation value" is defined as the maximum frequency deviation that is permitted for a given channel bandwidth in addition to a nominal error margin.

DETAILED DESCRIPTION OF THE PREFERRED EMBODIMENT

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

Figure 1:
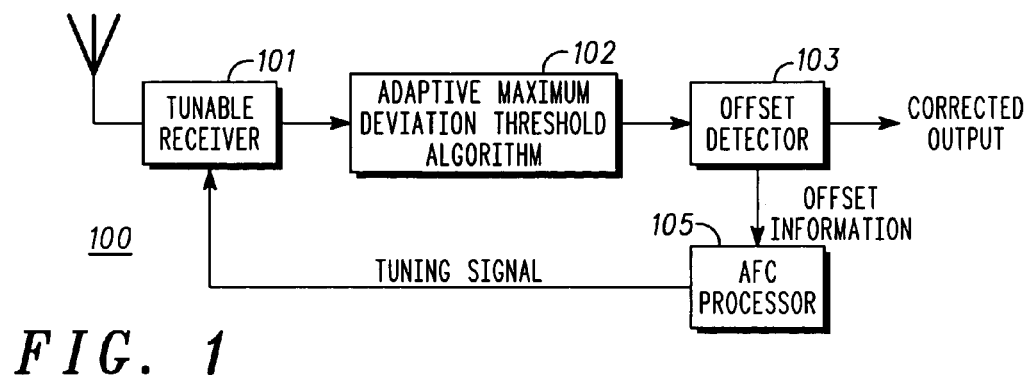
FIG. 1 is a block diagram showing operation of an automatic frequency control (AFC) system in a radio transceiver using an adaptive maximum deviation threshold algorithm.

Referring now to FIG. 1, a block diagram of an automatic frequency control (AFC) system 100 includes a tunable transceiver 101, an offset detector 103 and a processor 105. The tunable transceiver 101 is used for receiving and decoding radio frequency (RF) input signal information in either an analog or digital format and for transmitting such information. An adaptive maximum deviation threshold detector 102 is used for setting up an adaptive threshold to improve accuracy of the direct current (DC) component calculation for a received signal. The adaptive maximum deviation threshold detector 102 provides a system and method for setting up a new adaptive threshold and an algorithm for using the threshold. Each discriminated sample is compared or screened with this threshold/algorithm to determine if it should be used to compute the DC component for AFC. This will ensure stable operation of the AFC within the tunable transceiver 101. The new threshold is best termed as the "Adaptive Maximum Deviation" threshold. This threshold is adaptive since it is dependent upon the DC component, which estimates the frequency offset. It should be recognized by those skilled in the art that the system and process of the present invention may also be used in connection with other algorithms needing an accurate DC component.

Each new discriminator sample (phase difference information) from the tunable transceiver 101 is compared against an "Adaptive Maximum Deviation" threshold to check the validity of the phase difference information. An algorithm uses the DC component of the received signal and computes the "Adaptive Maximum Deviation" threshold based upon the DC component of the received signal and an adjusted maximum deviation value. The adjusted maximum deviation value is defined as the maximum frequency deviation that is permitted for a given channel bandwidth in addition to some nominal error margin.

Figure 3:
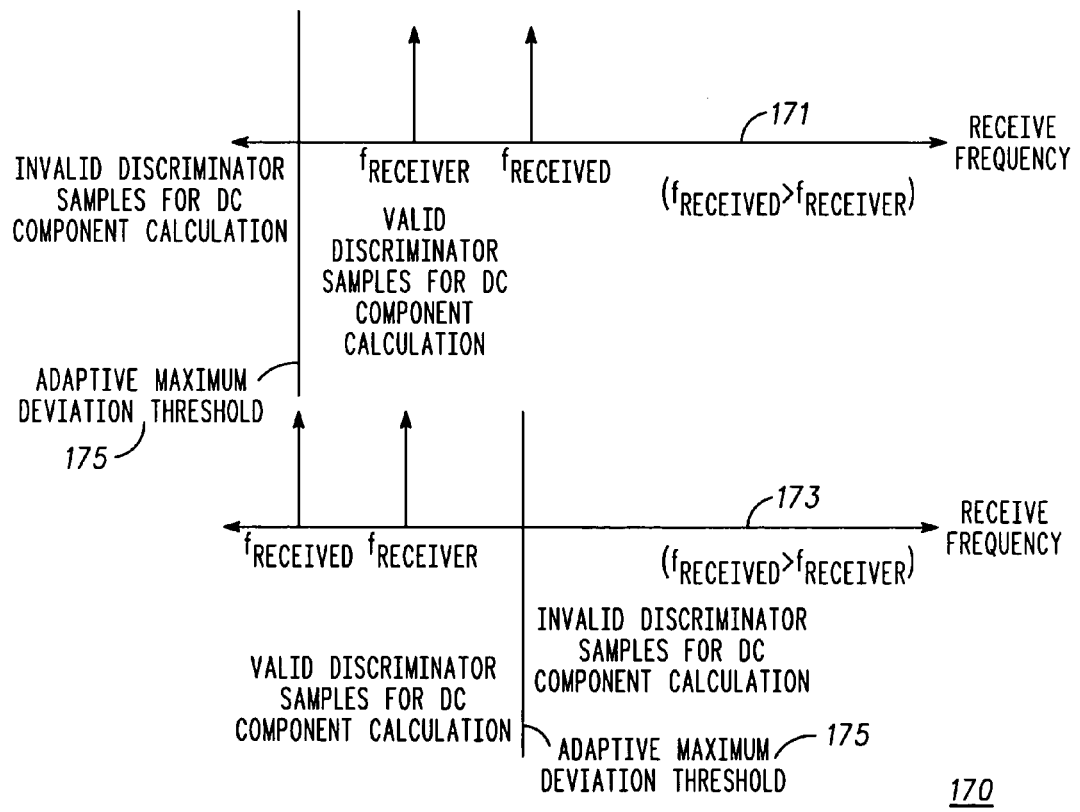
FIG. 3 is a diagram illustrating operation of the preferred method of the invention showing operation of the adaptive maximum deviation threshold algorithm in connection with automatic frequency control where the actual received frequency is greater than the receiver frequency and where the actual received frequency is lesser than the receiver frequency.
Figure 2:
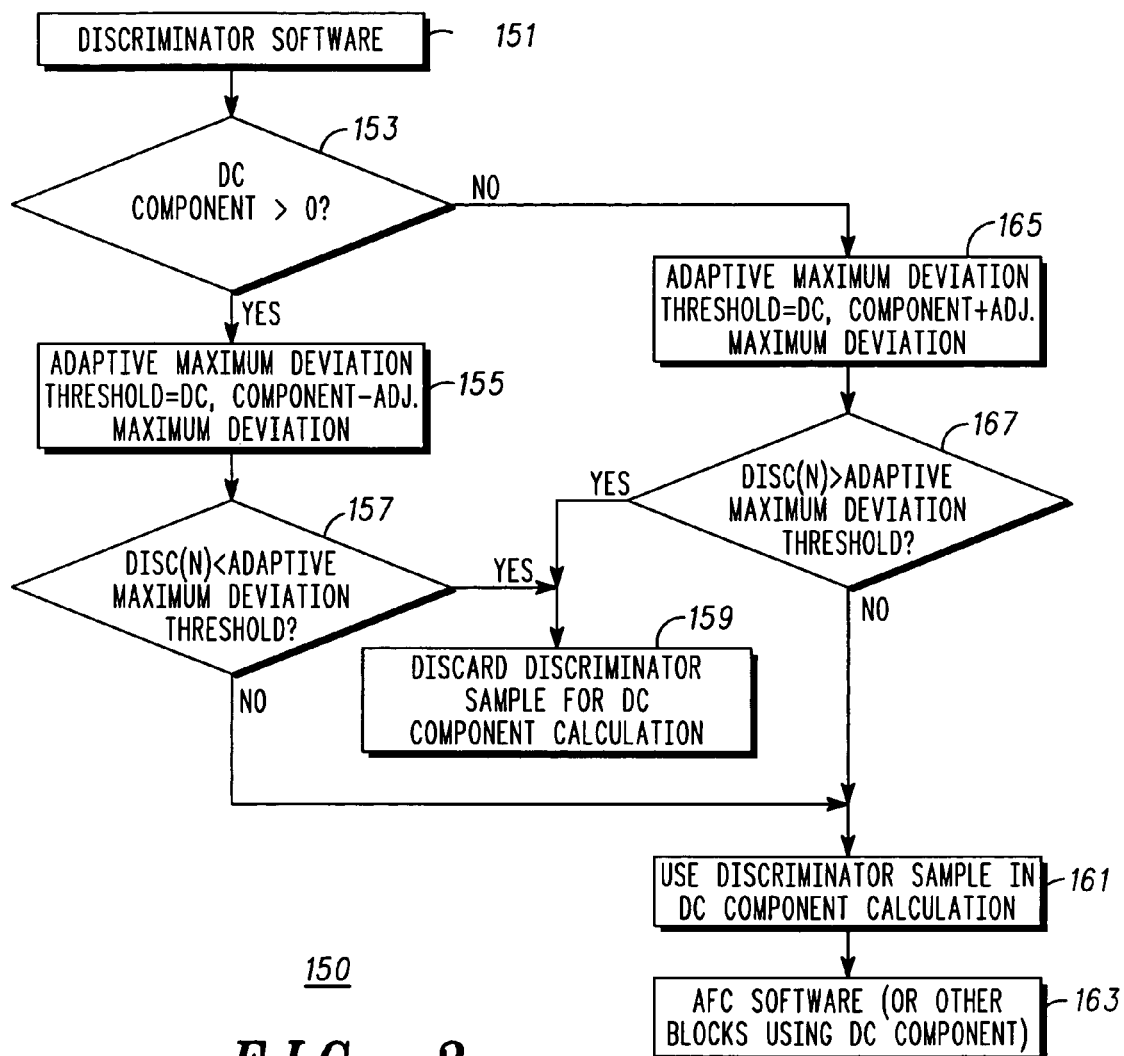
FIG. 2 is a flow chart showing operation of the adaptive maximum deviation threshold for use by the automatic frequency control (AFC) in accordance with the preferred embodiment of the invention.

As seen in FIGS. 2 and 3, a flowchart 150 depicts operation of the preferred embodiment of the invention. Samples are obtained from the discriminator software 151. The DC component of the discriminator sample is measured 153 and if the DC component is positive (i.e. the received signal has a positive frequency offset) then the new "Adaptive Maximum Deviation" threshold is computed 155 by subtracting the adjusted maximum deviation value from the current frequency error (DC component). It will be recognized that the DC component is an estimate of Frequency Error (frequency offset information). The next discriminator sample is then compared 157 with this new computed threshold. If the sample amplitude is less than the computed threshold then the sample is deemed 159 invalid and is not used to update the DC component value. If the sample amplitude is greater than the computed threshold that sample is used 161 in the calculation 163 of the DC component. Conversely, if the DC component is negative (i.e.—the received signal has a negative frequency offset) then the new "Adaptive Maximum Deviation" threshold is computed 165 by adding the adjusted maximum deviation value to the current frequency error (DC component). The next discriminator sample is compared 167 with this new computed threshold. If the sample amplitude is greater than the computed threshold then the sample is deemed 159 invalid and is not used to update the DC component value. Otherwise that sample is used 161 in the calculation 163 of the DC component. FIG. 3 specifically shows a diagram 170 of the position of the "Adaptive Maximum Deviation" threshold with respect to the receiver frequency in the cases where the actual received frequency is greater than the receiver frequency 171 and where the actual received frequency is lesser than the receiver frequency 173. In the first case 171 discriminator samples to the left of the "Adaptive Maximum Deviation" threshold 175 are deemed invalid for use in DC component calculation. Similarly, in the second case 173 discriminator samples to the right of the "Adaptive Maximum Deviation" threshold 175 are deemed invalid for use in DC component calculation.

In this manner, the adaptive threshold and the algorithm for using the threshold ensures a more accurate computation of the DC component for a received signal. The invention provides advantages in cases where the averaged DC component values incorrectly fall within a +/−2 kHz ("hardware tuning threshold") limit for frequency offsets of +/−3.5 to 4 kHz. In those instances, the AFC will incorrectly attempt to retune the transceiver. When using the instant invention the averaged DC component values never incorrectly fall within the +/−2 kHz ("hardware tuning threshold") limit. This will ensure stable operation of AFC. Thus, by not allowing AFC to pull the tunable transceiver off frequency for an interfering signal, the receive sensitivity of the transceiver will remain at its highest level and will not be degraded by the improper re-tuning due to the distorted discriminated samples. The processor 105, among other things, programs an operating frequency into the tunable transceiver 101, such that if the tuning is correct, the transceiver will be operating at the programmed frequency. An offset detector 103 is attached to the tunable transceiver 101 and is used for detecting the amount of frequency offset or difference between the transceiver operating frequency and a received frequency. The offset detector 103 works by extracting the direct current (DC) component of the demodulated signal. This DC value is proportional to the frequency offset between the transmitted frequency and transceiver frequency. The offset detector can be implemented on a digital signal processor (DSP) such as the DSP56600 DSP core within the DSP56677 dual-core processor manufactured by Motorola, Inc. The offset frequency is then passed on to the processor 105.

The processor 105 is a microcontroller such as the M*CORE 210 microcontroller (MCU) core within the DSP56677 dual-core processor manufactured by Motorola, Inc. or the like, that can rapidly compile, process and interpret the offset frequency information. The processor 105 uses the offset information and the thresholds to determine whether the transceiver tuning should be adjusted from its present setting. The processor 105 generates a tuning signal or tuning word that tunes the transceiver 101. It should be evident to those skilled in the art that the offset detector 103 may be integrated into the processor 105.

Figure 4:
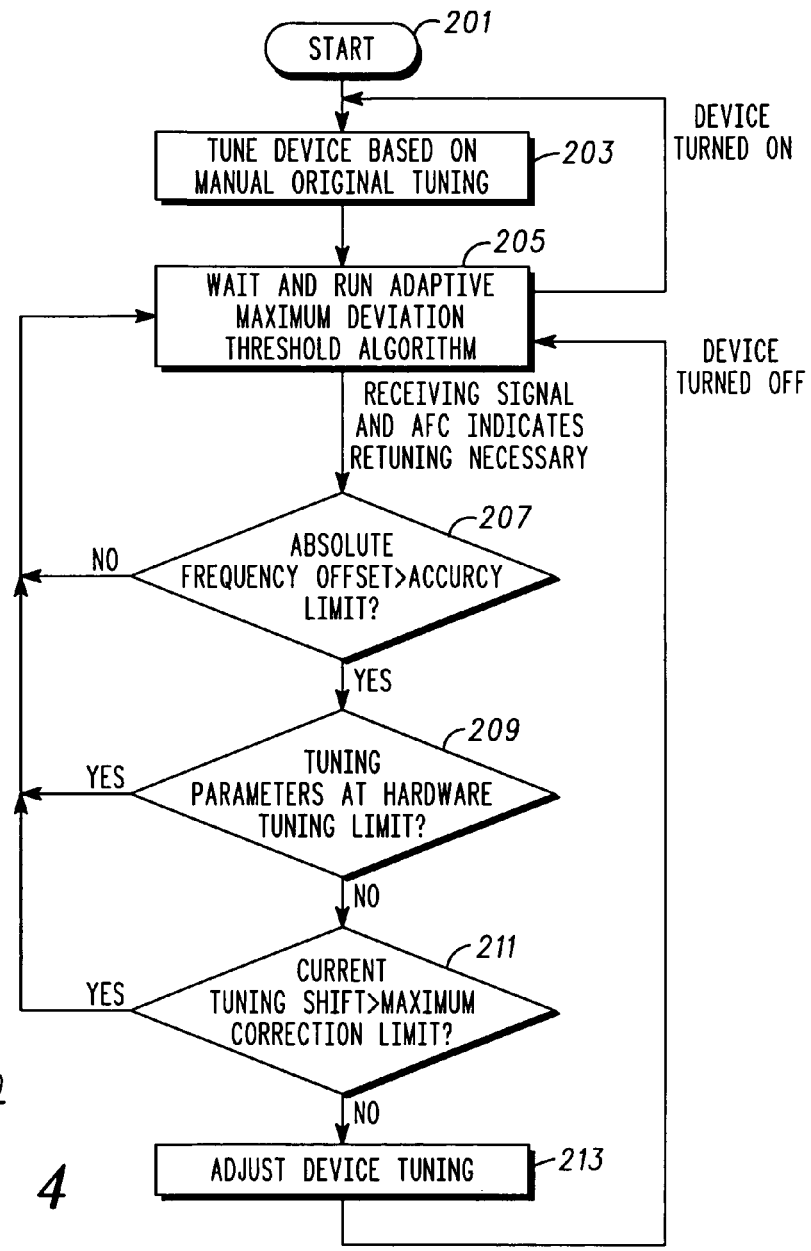
FIG. 4 is a flow chart showing a method for use in a radio transceiver for using an adaptive maximum deviation threshold algorithm to enable proper operation of an automatic frequency control (AFC) having multiple threshold levels according to the preferred embodiment of the invention.

In FIG. 4, a flowchart shows the preferred method 200 used by the processor 105 for selecting a correct tuning signal. Initially, the radio receiver or transceiver is activated 201 and the transceiver is tuned 203 based on its initial preset tuning frequency. This process is then halted 205 until the offset detector 103 detects an offset indicating that the transceiver operating frequency may need to be tuned or altered to an incoming signal frequency. While halted 205 the "Adaptive Maximum Deviation" threshold algorithm is executed and the "Adaptive Maximum Deviation" threshold is applied to ensure a more accurate computation of the DC component to be used by the offset detector 103.

When transceiver retuning is necessary, one or more thresholds or limits are measured to determine the amount or degree to which the transceiver tuning is to be changed by the AFC. The first threshold is an accuracy limit threshold 207. If the offset represents an absolute difference between the current transceiver operating frequency and actual received signal frequency, that is below the accuracy limit 207, the AFC will not work to correct the frequency difference. This avoids unneeded moving or oscillating around an ideal but unrealizable setting, and reduces processing requirements.

Secondly, a hardware tuning threshold 209 is employed that depends on the inherent tuning specifications of the specific transceiver. It will be evident to those skilled in the art that each transceiver will have a frequency range limited by the design and hardware used in the design. The hardware tuning threshold 209 is used with the measurement of the absolute difference between the current transceiver operating frequency and actual received signal frequency. The hardware tuning limit threshold 209 is defined by a predetermined radio transceiver specification. Should the offset require a correction placing the tuning setting outside the tuning specification or passband of the transceiver, i.e. outside the hardware tuning threshold 209, the AFC will not be activated to move the transceiver tuning.

Finally, the third threshold is the maximum correction threshold 211. This is a maximum or absolute difference in frequency that the transceiver tuning will be limited to with respect to the initial tuning. Thus, depending on the offset measurement from the offset detector 103, the AFC will not move or tune the transceiver receiving frequency if the absolute difference is above the maximum correction threshold 211. The first, second and third thresholds are used by the AFC processor to alter or adjust 213 the tuning of the tunable receiver of the transceiver 101 to the proper operating frequency.

Figure 5:
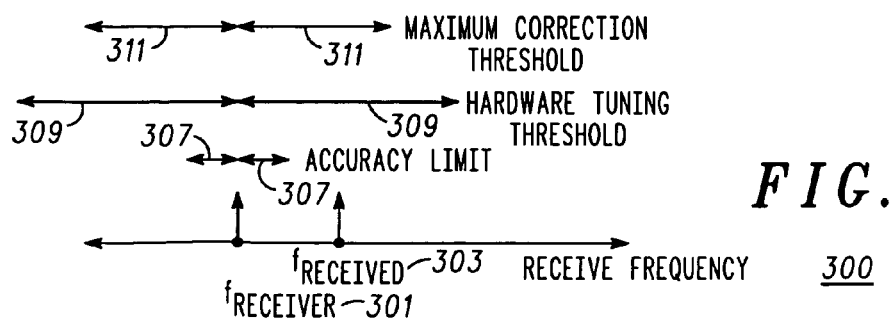
FIG. 5 is a diagram illustrating operation of the preferred method of the invention showing operation of the automatic frequency control with one or more thresholds defined as an accuracy limit, hardware tuning threshold and maximum correction threshold.

Moreover in FIG. 5, a diagram 300 illustrates a graphical relationship between the transceiver operating frequency 301 and the actual or incoming receiver frequency 303. Additionally, the receiver accuracy limit 307, hardware tuning threshold 309 and maximum correction threshold 311 are also shown in relation to the transceiver operating frequency 301. Those skilled in the art will recognize that the absolute difference is first measured between the transceiver operating frequency 301 and the incoming receiver frequency 303. This difference is then compared with the accuracy limit 307, hardware tuning threshold 309 and maximum correction threshold 311. This information is then processed by the processor 105 for providing stable and reliable operation of the AFC and tunable transceiver.

Thus, the present invention offers an improved system and method for setting a new adaptive threshold and an algorithm for using the threshold. Each discriminated sample is screened with this threshold/algorithm to determine if it should be used to compute the DC component for algorithms needing an accurate DC component. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An automatic frequency control (AFC) system comprising:
   a tunable transceiver for receiving and transmitting signals within a predetermined frequency range;
   an adaptive detector for comparing an incoming sample from the tunable transceiver to an adaptive maximum deviation threshold for determining if a sample from the tunable transceiver should be used for the direct current (DC) component of the AFC;
   an offset detector for determining a difference in frequency between a receive signal frequency and a transceiver operating frequency;
   a control processor for utilizing information from the offset detector to reduce the difference in frequency by moving the passband of the tunable transceiver towards the receive signal frequency where the control processor defines an accuracy limit threshold based upon the proximity of the receive signal frequency to the transceiver operating frequency, a maximum correction threshold based upon a predetermined maximum frequency correction limit, and a hardware tuning threshold based upon a predetermined tunable transceiver specification; and
   further wherein the accuracy limit threshold, maximum correction threshold and the hardware tuning threshold are used for efficiently controlling the predetermined frequency range of the tunable transceiver for efficient operation.

2. An AFC system as in claim 1, wherein the adaptive detector operates using the following steps:
   measuring a first signal sample from the radio transceiver to determine a DC component value based upon that first signal sample value and a group of previous signal sample values;
   calculating an adaptive maximum deviation threshold value based upon the DC component value;
   comparing the adaptive maximum deviation threshold value with a second signal sample value;
   determining if the second signal sample will be used to update the DC component value; and
   wherein the DC component value is used by the AFC in determining if the receiving frequency of the radio transceiver should be adjusted.

3. A radio transceiver as in claim 2, wherein the step of calculating includes the step of:
   subtracting the adjusted maximum deviation value from a measured DC component value if the DC component value has a positive value, to provide an adaptive maximum deviation threshold value.

4. A radio transceiver as in claim 2, wherein the step of calculating includes the step of:
   adding the adjusted maximum deviation value to a measured DC component value if the DC component value has a negative value, to provide an adaptive maximum deviation threshold value.

5. An AFC system as in claim 1, wherein the offset detector is integrated with the control processor.

6. A radio transceiver having a detector and at least one processor for controlling an automatic frequency control (AFC) tuning of the radio transceiver, the at least one processor utilizing a method comprising the steps of:
   comparing an incoming sample from the radio transceiver to an adaptive maximum deviation threshold for determining if the sample should be used for the direct current (DC) component of the AFC;
   determining if a frequency offset between the transceiver operating frequency and a received signal is larger than a first threshold limit, where the first threshold limit is determined by a predetermined absolute frequency offset;
   determining if a frequency offset between the transceiver operating frequency and a received signal is larger than a second threshold limit, where the second threshold limit is determined by a predetermined frequency specification of the radio transceiver;
   determining if a frequency offset between the transceiver operating frequency and the received signal is within a third threshold limit, where the third threshold limit is a predetermined maximum frequency correction; and
   wherein the first threshold limit, second threshold limit and third threshold limit are used by the at least one processor to ensure stable operation of AFC.

7. A radio transceiver as in claim 6, wherein the step of comparing an incoming sample comprises the steps of:
   measuring a first signal sample from the radio transceiver to determine a DC component value based upon that first signal sample value and a group of previous signal sample values;
   calculating an adaptive maximum deviation threshold value based upon the DC component value;
   comparing the adaptive maximum deviation threshold value with a second signal sample value;
   determining if the second signal sample will be used to update the DC component value; and
   wherein the DC component value is used by the AFC in determining if the receiving frequency of the radio transceiver should be adjusted.

8. A radio transceiver as in claim 7, wherein the step of calculating includes the step of:
   subtracting the adjusted maximum deviation value from a measured DC component value if the DC component value has a positive value, to provide an adaptive maximum deviation threshold value.

9. A radio transceiver as in claim 7, wherein the step of calculating includes the step of:
   adding the adjusted maximum deviation value to a measured DC component value if the DC component value has a negative value, to provide an adaptive maximum deviation threshold value.

10. A radio transceiver as in claim 6, wherein the first threshold limit is an accuracy limit.

11. A radio transceiver as in claim 6, wherein the second threshold limit is a hardware tuning threshold.

12. A radio transceiver as in claim 6, wherein the third threshold limit is a maximum correction threshold.

13. A method for use by at least one control processor for adjusting an automatic frequency control (AFC) in a radio transceiver receiving signals at a transceiver operating frequency comprising the steps of:
   comparing an incoming sample from the radio transceiver to an adaptive maximum deviation threshold for determining if the sample should be used to for the direct current (DC) component of the AFC;
   determining a frequency difference between the transceiver operating frequency and an incoming signal frequency;
   comparing the frequency difference with a predetermined accuracy limit defined by a predetermined maximum frequency offset of the transceiver operating frequency from an actual receive frequency;

comparing the frequency difference with a predetermined hardware tuning threshold defined by a predetermined radio transceiver specification;

comparing the frequency difference with a predetermined maximum correction threshold defined by a predetermined maximum correction from the transceiver operating frequency; and processing at least one of the comparing steps in a microprocessor to provide correction information to stabilize the automatic frequency control to provide stable operation of the radio transceiver.

14. A method for use by at least one control processor as in claim 13, wherein the step of comparing an incoming sample comprises the steps of:

measuring a first signal sample from the radio transceiver to determine a DC component value based upon that first signal sample value and a group of previous signal sample values;

calculating an adaptive maximum deviation threshold value based upon the DC component value;

comparing the adaptive maximum deviation threshold value with a second signal sample value;

determining if the second signal sample will be used to update the DC component value; and wherein the DC component value is used by the AFC in determining if the receiving frequency of the radio transceiver should be adjusted.

15. A radio transceiver as in claim 14, wherein the step of calculating includes the step of:

subtracting the adjusted maximum deviation value from a measured DC component value if the DC component value has a positive value, to provide an adaptive maximum deviation threshold value.

16. A radio transceiver as in claim 14, wherein the step of calculating includes the step of:

adding the adjusted maximum deviation value to a measured DC component value if the DC component value has a negative value, to provide an adaptive maximum deviation threshold value.

17. A radio transceiver having an automatic frequency control (AFC) for tuning of the radio transceiver, the radio transceiver using a method to control AFC comprising the steps of:

measuring a first signal sample from the radio transceiver to determine a DC component value based upon that first signal sample value and a group of previous signal sample values;

calculating an adaptive maximum deviation threshold value based upon the DC component value;

comparing the adaptive maximum deviation threshold value with a second signal sample value;

determining if the second signal sample will be used to update the DC component value; and wherein the DC component value is used by the AFC in determining if the receiving frequency of the radio transceiver should be adjusted.

18. A radio transceiver as in claim 17, wherein the step of calculating includes the step of:

subtracting the adjusted maximum deviation value from a measured DC component value if the DC component value has a positive value, to provide an adaptive maximum deviation threshold value.

19. A radio transceiver as in claim 17, wherein the step of calculating includes the step of:

adding the adjusted maximum deviation value to a measured DC component value if the DC component value has a negative value, to provide an adaptive maximum deviation threshold value.

* * * * *